METHOD OF FORMING CONTACTS TO EPITAXIAL
GaAs AND THE RESULTING STRUCTURE
Filed Sept. 1, 1970

INVENTORS
ALBERT Y.C. YU
HOWARD J. GOPEN
ROBERT K. WAITS

BY Alan H. MacPherson
ATTORNEY

United States Patent Office 3,702,290
Patented Nov. 7, 1972

3,702,290
METHOD OF FORMING CONTACTS TO EPITAXIAL GaAs AND THE RESULTING STRUCTURE

Albert Y. C. Yu, Sunnyvale, Howard J. Gopen, Palo Alto, and Robert K. Waits, Sunnyvale, Calif., assignors to Fairchild Camera and Instrument Corporation, Mountain View, Calif.
Filed Sept. 1, 1970, Ser. No. 68,693
Int. Cl. C23c *15/00*
U.S. Cl. 204—192 9 Claims

ABSTRACT OF THE DISCLOSURE

Ohmic contacts are formed to epitaxial gallium arsenide by sputtering the contact constituents onto the gallium arsenide surface. By controlling the constituents of the ohmic contact, the temperature at which the ohmic contact alloys with the underlying gallium arsenide is kept beneath the temperature at which the ohmic contact melts. This prevents the formation of islands of contact material on the gallium arsenide surface and thus ensures ohmic contacts with predictable characteristics.

BACKGROUND OF THE INVENTION

Field of the invention

This invention relates to ohmic contacts to semiconductor material and in particular to a method of forming reliable ohmic contacts to epitaxial gallium arsenide and the resulting structure.

Description of the prior art

N. Braslau, J. B. Gunn and J. L. Staples in an article entitled "Metal-Semiconductor Contacts for GaAs Bulk Effect Devices," in vol. 10 of Solid State Electronics, pp. 381–383, published by Pergamon Press (1967) discuss the formation of contacts to GaAs. Tin, a gold-germanium-nickel alloy and a gold-germanium alloy are used by Braslau et al. to form the contact. Braslau et al. report that thin films of the eutectic alloy of gold and germanium evaporated on GaAs formed "minute droplets on heating to the melting point." The resulting gold-germanium contact film had an "island structure." The balling up of the gold-germanium alloy, due to the high surface tension of this alloy, occurs at about 350–380° C. However, the gold-germanium alloy forms an alloy with the n-type gallium arsenide at 500° C. Thus the balling up occurs before the gold-germanium contact layer can alloy with the underlying gallium arsenide.

To assist in making ohmic contacts to gallium arsenide, the surface of the gallium arsenide must be heavily doped, either n or p-type. Aluminum or gold does not dope the surface of the gallium arsenide very heavily. Germanium does dope this surface, making the surface n-type. Zinc makes the gallium arsenide surface p-type.

The prior art has attempted to evaporate a uniform layer of gold-germanium or gold-zinc on the surface of gallium arsenide. Evaporation of a gold-germanium alloy has not given reproducible results while the energy of the evaporated zinc atoms was so low the zinc would not stick to the gallium arsenide surface. While sputtering has formerly been used for making thin film layers on substrates, sputtering heretofore has not been used to make ohmic contacts to gallium arsenide because the sputtered material was expected to damage the gallium arsenide surface on impact.

SUMMARY OF THE INVENTION

This invention, on the other hand, successfully sputters material on to the surface of gallium arsenide for use in making ohmic contact thereto. The technique of this invention achieves a contact layer of the desired composition and successfully avoids deleterious damage to the surface of the gallium arsenide material.

According to this invention, a cathode comprised of the major constituent of the contact alloy, has placed on it dots of the minor constituent of the alloy. Sputtering then takes place. The resulting contact film on the surface of the gallium arsenide is the desired alloy. The contact film is then alloyed to the underlying gallium arsenide. By controlling the composition of the sputtered alloy such that its melting temperature is above its alloying temperature with gallium arsenide, balling up of the contact layer is avoided and successfully-alloyed contacts are obtained.

In one embodiment, the target cathode is gold with dots of germanium placed on the surface of the gold. These dots occupy a percentage of surface area of the cathode proportional to the volume percentage of the dot material in the alloy. This dot surface area is also adjusted by an empirically observed yield ratio. The composition of the gold-germanium alloy is such that its melting temperature is greater than 500° C., the alloying temperature of this particular gold-germanium alloy with gallium arsenide. The gold-germanium film is 400–500 angstroms thick and, after alloying to the gallium arsenide, provides a contact-resistance on the order of $10^{-4}$ to $10^{-5}$ ohm-cm.$^2$.

To form contacts on p-type gallium arsenide, a gold-zinc film is sputtered sequentially onto the gallium arsenide. First, a layer of zinc is sputtered from a zinc cathode onto the surface of the gallium arsenide. Zinc does not stick well to a gallium arsenide surface. However, by flooding the gallium arsenide surface with zinc atoms at 10 times the energy present in evaporated zinc atoms, a thin layer of zinc atoms forms on the gallium arsenide and then other zinc atoms stick readily to this layer. After the desired thickness of zinc has formed, typically 100 angstroms, a gold cathode is substituted for the zinc and the sputtering continues with a desired thickness layer of gold forming on the zinc. The Au-Zn contact is again alloyed to the underlying gallium arsenide.

During the sputtering, the underlying gallium arsenide surface is damaged due to the impact of the alloy materials on this surface. However, subsequent alloying of the resulting contact layers into the gallium arsenide obliterates this damage and thus yields good contacts with a contact resistance on the order of $10^{-4}$ to $10^{-5}$ ohm-cm.$^2$.

DETAILED DESCRIPTION

Figure 1:
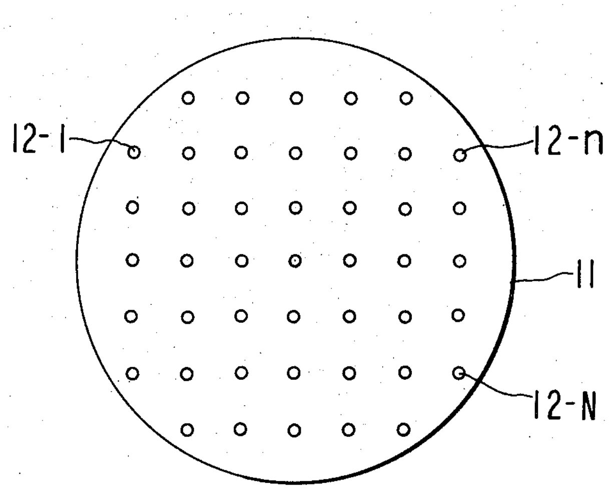
FIG. 1 shows the arrangement of the sputtering cathode to achieve the desired alloy composition in the sputtered film.
Figure 3:
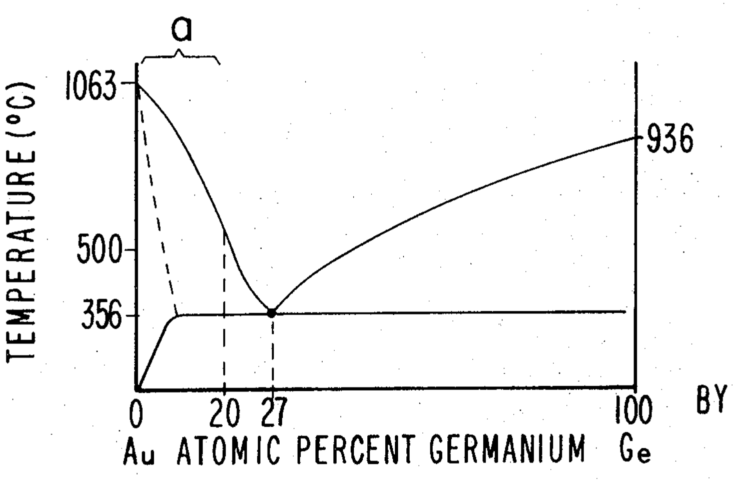
FIG. 3 is the binary phase diagram of the gold-germanium alloy.

To implement the sputtered contacts of this invention, a cathode 11 (FIG. 1) with its top surface composed of the basic constituent of the contact alloy, has placed upon it dots 12–1 through 12–N, where N is a selected integer, of the minor constituent of the contact alloy. The ratio of the surface area of the dots 12 to the exposed area of the basic constituent 11 in the contact alloy is equivalent to the volume composition of the constituents in the resulting alloy, adjusted for the sputtering yield ratios of the materials involved. These yield ratios reflect the fact that in sputtering, the number of atoms removed from the cathode per incident ion is dependent on the material being sputtered. Cathode 11 with dots 12 upon it is placed in the sputtering apparatus. A glow discharge is established in the vacuum system by techniques well known in the art and ions typically of argon are directed at the surface of the cathode. Atoms of the basic constituent 11 and dot material 12 are dislodged by the impacting ions and some of these atoms deposit onto the surface of the gallium arsenide wafer. A mask prevents formation of the contact layer on all except the desired portions of the wafer. Or alternately, the contact area can be subsequently delineated by well known photo-etching techniques. The sputtering continues until the desired thickness of the contact film is formed on the surface of the gallium arsenide wafer. The film is uniform in composition reflecting the fact that atoms of all components are continuously arriving at the gallium arsenide surface. However, the composition of the contact alloy is selected so that its melting point is above the temperature at which the composition alloys with the gallium arsenide. When gold and germanium are the constituents of the composition, the composition is selected, as shown in the gold-germanium binary phase diagram of FIG. 3, such that gold occupies a large percentage of the alloy while germanium is but a small percentage of the alloy. Gold-germanium alloys in the region *a* of the phase diagram have this property. The resulting alloy melting temperature is above 500° C. as illustrated.

Figure 2:
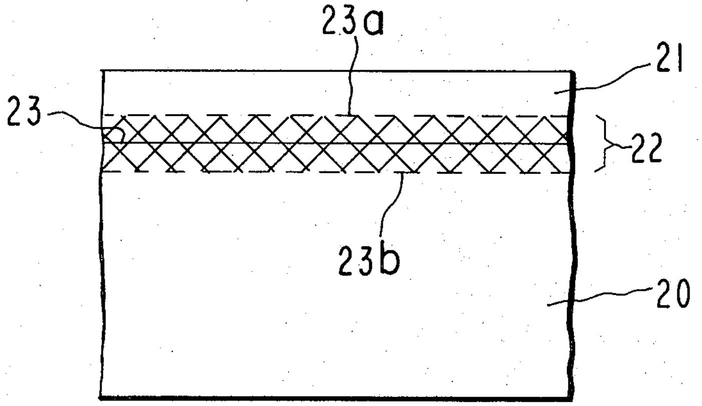
FIG. 2 shows in cross-section the contact layer on the resulting substrate together with the intermediate alloy formed between the two.

After the desired thickness contact layer has been formed on the surface of the gallium arsenide, the gallium arsenide wafer, together with the contact layer, is heated to form an alloy between the contact layer and the gallium arsenide layer. As shown in FIG. 2, surface 23 between contact layer 21 and wafer 20 disappears and in its place is formed an alloy of the overlying contact material and the underlying gallium arsenide. Any damage to surface 23 by sputtering material 21 is rendered unimportant by this alloying. When the contact layer 21 is gold-germanium, then the alloy with the underlying gallium arsenide forms at approximately 500° C. However, as shown by the phase diagram in FIG. 3, the composition of the gold-germanium alloy has been selected to be in region *a* so that its melting temperature is above 500° C. Accordingly, the contact material does not melt and ball-up before it alloys with the underlying gallium arsenide. Consequently, contact layer 21 alloys uniformly in region 22 with the underlying gallium arsenide 20 to form a good quality ohmic contact.

Typically, the sputtering is carried out in the sputter chamber in an argon atmosphere with a pressure between $10^{-1}$ and $10^{-3}$ torr. When the contact layer is gold-germanium, the impact energy of the gold-germanium atoms on the gallium arsenide wafer is kept low by keeping the cathode potential at less than 3 kilovolts. In one embodiment of this invention, the cathode target was DC diode sputtered in argon atmosphere at a current density of about 0.5 ma./cm.$^2$ and a pressure of $4\times10^{-2}$ torr. The target potential was 2.5 kilovolts. The substrates were protected by a movable shutter during a pre-sputter time of 15–45 seconds; the sputtering time for a 1000 angstrom film was 70–80 seconds. A liquid nitrogen trapped diffusion pump vacuum system was used. Background pressure prior to sputtering was less than $3\times10^{-7}$ torr. The sputtered contact layer had a composition of about 12 atomic percent germanium and 88 atomic percent gold. Such a composition will not completely melt until over 900° C. Accordingly, this contact film alloyed with the underlying gallium arsenide in much the same way as does pure gold, that is, at small, localized areas at 400° C.

The behavior of the gold-germanium contact deposited as described above is explained by a model in which the surface layer of the underlying gallium arsenide is doped heavily n-type by germanium from the gold-germanium contact and only a thin potential barrier is present at the interface between the contact and the gallium arsenide. This barrier is essentially transparent to electron flow.

To form contacts to p-type gallium arsenide, a slightly different technique is employed compared to that used with n-type gallium arsenide. The constituents of the contact, typically zinc and gold, are formed separately on a rotating jig in the sputtering chamber. First, a layer of zinc, typically 100 angstroms thick, is sputtered onto the selected portions of the gallium arsenide wafer. Sputtering gives to the zinc atoms the desired impact energy on the gallium arsenide surface so that enough zinc atoms stick to the gallium arsenide to form a thin layer of atoms along this surface. Once this thin atomic layer of zinc has been formed on the gallium arsenide, other zinc atoms will form on top of this layer. The sticking coefficient of zinc to pure gallium arsenide is 0.1 or less. With a thin layer of zinc formed on the gallium arsenide this sticking coefficient rises to between 0.9 to 1. The sticking coefficient represents the ratio of atoms sticking to the surface to total atoms impacting on the surface.

After the selected thickness layer of zinc has been formed on the surface, the substrate is moved such that the gallium arsenide wafer is above a gold sputtering target. Sputtering continues and a desired thickness of gold is formed on top of the zinc. Typically the gold can be 1000 angstroms thick. Next, the wafer and the zinc-gold layers are alloyed. The gold and zinc alloys with the underlying gallium arsenide to form an ohmic contact.

In depositing a gold-zinc contact in accordance with this invention, separate zinc and gold targets were sequentially exposed to a target potential of 3 kilovolts. A 0.65 ma./cm.$^2$ current density was used with zinc and a 0.4 ma./cm.$^2$ current density was used with the gold. Zinc was pre-sputtered for 45 seconds and the deposition time was 10 seconds giving an estimated zinc thickness of about 100 angstroms. However, the zinc film thickness was difficult to measure by interferometric techniques because of its matte surface. Gold was then deposited for 45 seconds giving a total film thickness of gold plus zinc of 1100 to 1200 angstroms. Sputtering was carried out in an argon atmosphere at about $10^{-2}$ to $10^{-4}$ torr. The contact became ohmic after a 450° C. alloy. The current is temperature insensitive. With both the gold-zinc and the gold-germanium contacts, alloying was carried out in dry nitrogen for about 5 minutes.

Typical contact resistances obtained from zinc-gold contacts on p-type gallium arsenide varied as a function of the impurity concentration in the underlying gallium arsenide. For impurity concentrations varying from $2\times10^{17}$ atoms per cm.$^3$ to $2\times10^{19}$ atoms per cm.$^3$, the typical resistance of the contact varied from about $1.2\times10^{-3}$ to $1.9\times10^{-4}$ ohm-cm.$^2$.

It should be noted that when the underlying p-type gallium arsenide is heavily doped (doping concentration greater than $10^{19}$ atoms per cm.$^3$), low resistance ohmic contacts can be made by an unalloyed gold film deposited directly on the gallium arsenide without any zinc. This occurs because the solubility limit of zinc in gallium arsenide is about $5\times10^{18}$ cm.$^{-3}$ at 500° C. Any zinc present in the gold film would not dissolve in the adjacent region of gallium arsenide as this region already contains zinc to its solubility limit.

The contacts formed by this invention are reproducible, with contact resistance on the order of $10^{-3}$ to $10^{-5}$ ohm-cm.$^2$. This technique forms good contacts on pure epitaxial gallium arsenide, an accomplishment which has been sought for years by those in the semiconductor arts.

While two methods of forming contacts to gallium arsenide wafers have been described, variations of these methods can also be used. For example, bias sputtering can be used to yield improved results by removing absorbed layers from the gallium arsenide surface. Rf sputtering could be used. Also, a gold-germanium alloy cathode can be employed for the sputtering rather than gold with germanium dots formed thereon.

What is claimed is:

1. The method of forming on gallium arsenide an ohmic contact with a contact resistance of less than about $1.2 \times 10^{-3}$ ohm-cm.$^2$ from an alloy, which comprises:

sputtering simultaneously the constituents of the alloy onto the gallium arsenide surface in such a manner that the melting temperature of the sputtered alloy is above the alloying temperature of the alloy with gallium arsenide, and alloying the resulting sputtered constituents into the underlying gallium arsenide surface by heating the constituents and the gallium arsenide to a temperature less than the melting temperature of the alloy formed from the sputtered constituents, thereby avoiding the balling up of the sputtered alloy layer.

2. The method of claim 1 wherein the target cathode comprises the major constituent of said ohmic contact with a plurality of regions of at least one minor constituent of said ohmic contact formed on one surface of said major constituent.

3. The method of claim 2 wherein said minor constituent of said ohmic contact is formed on said target cathode in the form of dots.

4. The method of claim 3 wherein the surface area of the minor constituent of said ohmic contact on the target cathode is proportional to the volume percent of said minor constituent in said ohmic contact, adjusted for the atomic yield ratios of the minor constituent of the ohmic contact to the major constituent of the ohmic contact.

5. The method of claim 4 wherein said major constituent of said ohmic contact is gold and said minor constituent of said ohmic contact is germanium.

6. The method of claim 5 wherein said germanium occupies a surface area on said cathode such that the volume percentage of said germanium in said ohmic contact is less than twenty percent (20%) so that the melting temperature of said gold-germanium mixture is greater than the alloying temperature of the gold-germanium with the underlying gallium arsenide.

7. The method of claim 6 wherein the target cathode comprises a uniform mixture of germanium and gold.

8. The method of forming on gallium arsenide on ohmic contact with a contact resistance of less than about $1.2 \times 10^{-3}$ ohm-cm.$^2$ from an alloy, which comprises:

sputtering the constituents of the ohmic contact onto the gallium arsenide surface by first sputtering the minor constituent of the ohmic contact onto the gallium arsenide surface and then sputtering the major constituent of the ohmic contact onto the minor constituent on said gallium arsenide surface, so as to achieve a proportion of constituents which when alloyed, have a melting temperature greater than the alloying temperature of the alloy with gallium arsenide; and alloying the said sputtered constituents into the underlying gallium arsenide surface by heating the constituents and the gallium arsenide to a temperature less than the melting temperatures of the alloy formed from the sputtered constituents, thereby avoiding the balling up of the sputtered alloy layer.

9. The method of claim 8 wherein said major constituent of said ohmic contact comprises gold and said minor constituent of said ohmic contact comprises zinc.

References Cited

UNITED STATES PATENTS

| | | | |
|---|---|---|---|
| 3,450,581 | 6/1969 | Shortes | 204—192 |
| 3,522,164 | 7/1970 | Sumner | 204—192 |
| 3,477,935 | 11/1969 | Hall | 204—192 |

JOHN H. MACK, Primary Examiner

S. S. KANTER, Assistant Examiner

U.S. Cl. X.R.

317—234 L